United States Patent [19]

Klinck

[11] Patent Number: 5,727,166
[45] Date of Patent: Mar. 10, 1998

[54] BUFFER WITH DRIVE CHARACTERISTICS CONTROLLABLE BY SOFTWARE

[75] Inventor: Jay Klinck, Durham, N.C.

[73] Assignee: Mitsubishi Semiconductor America, Inc., Durham, N.C.

[21] Appl. No.: 659,599

[22] Filed: Jun. 6, 1996

Related U.S. Application Data

[63] Continuation of Ser. No. 102,328, Aug. 5, 1993, abandoned.

[51] Int. Cl.$^6$ .................................................. G06F 13/10
[52] U.S. Cl. ............................................ 395/250; 257/368
[58] Field of Search ............................... 395/250; 357/59; 307/296.4; 257/368

[56] References Cited

U.S. PATENT DOCUMENTS

| | | | |
|---|---|---|---|
| 4,360,852 | 11/1982 | Gilmore | 361/98 |
| 4,908,755 | 3/1990 | Feldtkeller | 363/56 |
| 5,047,666 | 9/1991 | Astegher et al. | 307/353 |
| 5,146,306 | 9/1992 | Ferry et al. | 357/41 |
| 5,212,412 | 5/1993 | Atriss et al. | 307/296.4 |
| 5,221,865 | 6/1993 | Phillips et al. | 307/465 |
| 5,248,906 | 9/1993 | Mahmood | 307/443 |
| 5,315,174 | 5/1994 | Chang et al. | 307/443 |
| 5,331,220 | 7/1994 | Pierce et al. | 307/475 |
| 5,384,499 | 1/1995 | Pedersen et al. | 326/39 |

OTHER PUBLICATIONS

Controlled Slew Rate Output Buffer by Kam Leung, IEEE, 1988 Publication pp. 5.5.1–5.5.4.

*Primary Examiner*—Krisna Lim
*Assistant Examiner*—Zarni Maung
*Attorney, Agent, or Firm*—Lowe, Price, LeBlanc & Becker

[57] ABSTRACT

A buffer with drive characteristics controllable by software includes a plurality of MOSFETs connected in parallel between input and output terminals of the buffer. The drains of the MOSFETs are coupled to the output terminal, whereas the gates of the MOSFETs are connected through logic gate circuits to the input terminal and to corresponding registers of a programmable controller. The gates of the MOSFETs go high or low in order to turn the MOSFETs on and off in accordance with a preset program loaded by an external programming device. The number of MOSFETs turned on is a determining factor for the strength and rise time of the signals formed by the buffer.

19 Claims, 7 Drawing Sheets

BUFFER WITH DRIVE CHARACTERISTICS CONTROLLABLE BY SOFTWARE

This application is a continuation of application Ser. No. 08/102,328 filed Aug. 5, 1993 now abandoned.

TECHNICAL FIELD

This invention relates to buffers and, more particularly, to buffers with drive characteristics controllable by software.

BACKGROUND ART

Advancement in CMOS integrated circuit design has lead to vast improvements in the speed of integrated circuits, i.e. the time in which the output of a circuit reacts in response to a new input. Increasing integrated circuit speed has resulted in faster output signals with reduced rise time. However, faster signals can cause transients such as noise spikes on the power, ground and data buses, which result in data errors, latch-up and other problems in the digital electronic circuitry. As shown in FIG. 1, wherein a slower signal is compared with a faster signal, the slower signal causes a much lower level of noise spikes than the faster signal.

Moreover, in order to reduce power consumption, the supply voltage of integrated circuits is reduced. As shown in FIG. 2, a lower supply voltage causes integrated circuits to become more susceptible to noise, including crosstalk and ground bounce.

Therefore, to reduce noise, all signals except those for speed-critical applications should have a slower rate of rise.

Buffers are used in digital integrated circuits to provide electrical interaction between a driving circuit and a driven circuit. The drive characteristics of the buffer determine the strength and rise time of signals formed by the buffer. In particular, to modify the rise time, slew rate control of the buffer is used. A slew rate of a buffer is defined as the rate of output transition per unit time. In view of the above, it would be desirable to provide buffers having drive characteristics customizable by the user to modify the strength and rise time of buffered signals in accordance with a particular application. It would also be desirable to provide buffers having the slew rate controllable by software in accordance with a particular application.

DISCLOSURE OF THE INVENTION

Accordingly, one advantage of the invention is in providing buffers customizable by the user to modify the rise time and strength of buffered signals in accordance with a particular application.

Another advantage of the invention is in providing buffers having slew rate controllable by software in accordance with a particular application.

Further advantage of the application is in providing software control of a buffer to modify its drive characteristics once the integrated circuit chip, which comprises the buffer, is fabricated.

The above and other advantages of the invention are achieved, at least in part, by providing a buffer, which comprises a plurality of active switching elements connected between input and output terminals of the buffer. Each of the active switching elements is turned on or off by a programmable controller in accordance with a preset program. Since the slew rate of the buffer is proportional to the strength of the output signal formed by the buffer, the number of active elements which are turned on is a determining factor for the slew rate. Accordingly, the present invention provides software control of slew rate.

In accordance with a preferred embodiment, the plurality of active elements comprises a plurality of switching devices coupled in parallel between the input and output terminals. The switching devices may comprise MOSFET transistors, having their gates coupled to the input terminal and their drains coupled to the output terminal. The switching devices may be divided into a plurality of linear arrays, controlled by corresponding binary digits stored in a register of the programmable controller. The number of the linear arrays is equal to a number of binary digits in the register. Each of the arrays comprises a number of switching elements equal to a maximum value of the corresponding binary digit.

In accordance with one aspect of the present invention, the programmable controller may comprise an analog-digital converter for converting an analog control signal into a digital value.

In accordance with another aspect of the present invention, the buffer may be controlled by control program created by interconnection of wires on an external control panel.

In accordance with further aspect of the present invention, the buffer is located on the same integrated circuit chip as the circuits supplied with the buffered signal. The register of the programmable controller is loaded by a programming device external with respect to the integrated circuit chip.

Still other advantages of the present invention will become readily apparent to those skilled in this art from the following detailed description, wherein only the preferred embodiment of the invention is shown and described, simply by way of illustration of the best mode contemplated of carrying out the invention. As will be realized, the invention is capable of other and different embodiments, and its several details are capable of modifications in various obvious respects, all without departing from the invention. Accordingly, the drawing and description are to be regarded as illustrative in nature, and not as restrictive.

BEST MODE FOR CARRING OUT THE INVENTION

Figure 1:
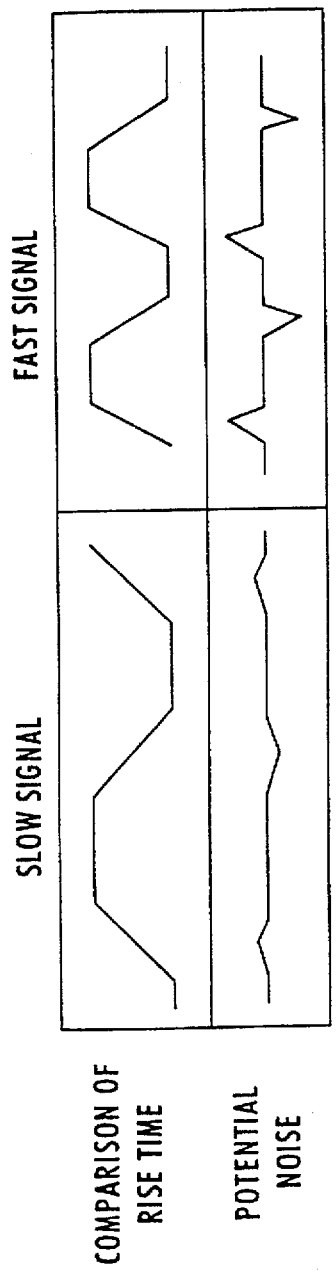
FIG. 1 is a diagram illustrating comparison of noise induced by a slower signal with noise induced by a faster signal.
Figure 2:
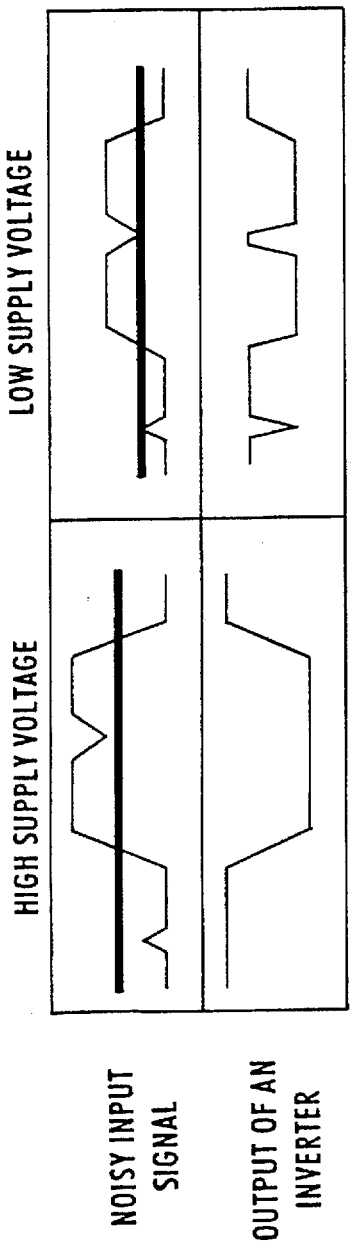
FIG. 2 is a diagram illustrating dependence of noise from a supply voltage.
Figure 3:
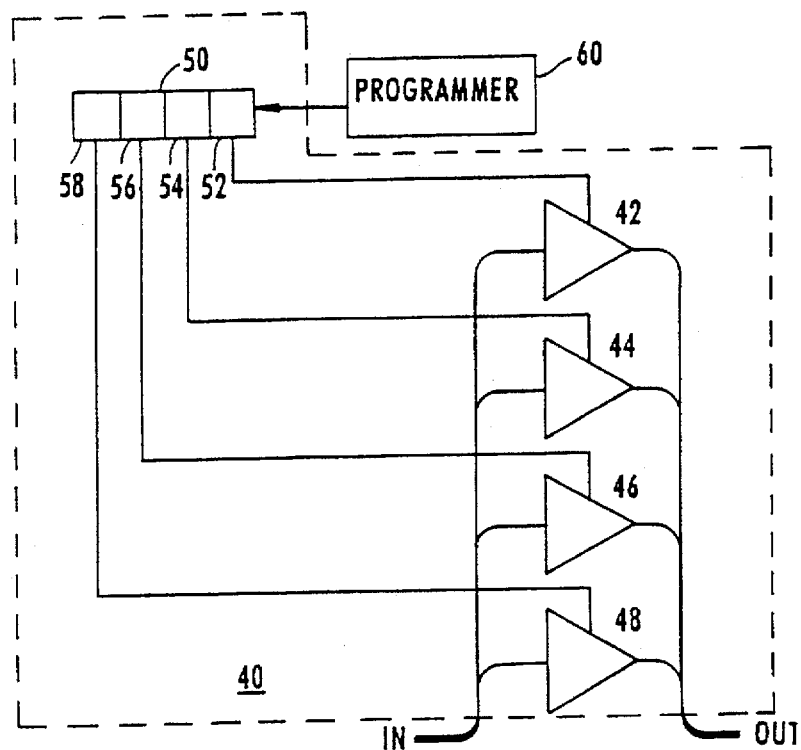
FIG. 3 is a simplified diagram showing principles of the present invention.

Reference is now made to FIG. 3 of the drawings illustrating principles of the present invention. According to the preferred embodiment of the present invention, buffer 40 comprises active elements 42–48 connected in parallel between an input IN and an output OUT, and a programmable controller 50. The total strength of the output signal of the buffer is proportional to a number of the active elements 42–48. Since the slew rate of the buffer 40 is related to the strength of the output signal, the number of the active elements 42–48 is a determining factor for the rise time of the signal formed at the output of the buffer 40. The active elements 42–48 are respectively coupled to registers 52–58 of the programmable controller 50. The registers 52–58 comprise a preset control value, which determines a number of the active elements 42–48 connected at a given time between the input and the output of the buffer 40. For example, if any one of the registers 52–58 comprises binary 1, the corresponding active element is enabled. If one of the registers 52–58 comprises binary 0, the corresponding active element is disabled. Accordingly, binary number 1111 in the registers 52–58 causes all of the elements 42–48 between the input and the output of the buffer 40 to be enabled. Binary number 1110 causes the elements 44–48 to be enabled, and the element 42 to be disabled. Binary number 1100 results in enabling the elements 46 and 48 and disabling the elements 42 and 44. Binary number 1000 corresponds to on status of the element 48 and off status of elements 42, 44 and 46, etc. The programmable controller 50 may be loaded with the control value by an external programming device 60 after the integrated circuit chip comprising the buffer 40 is fabricated.

Figure 3A:
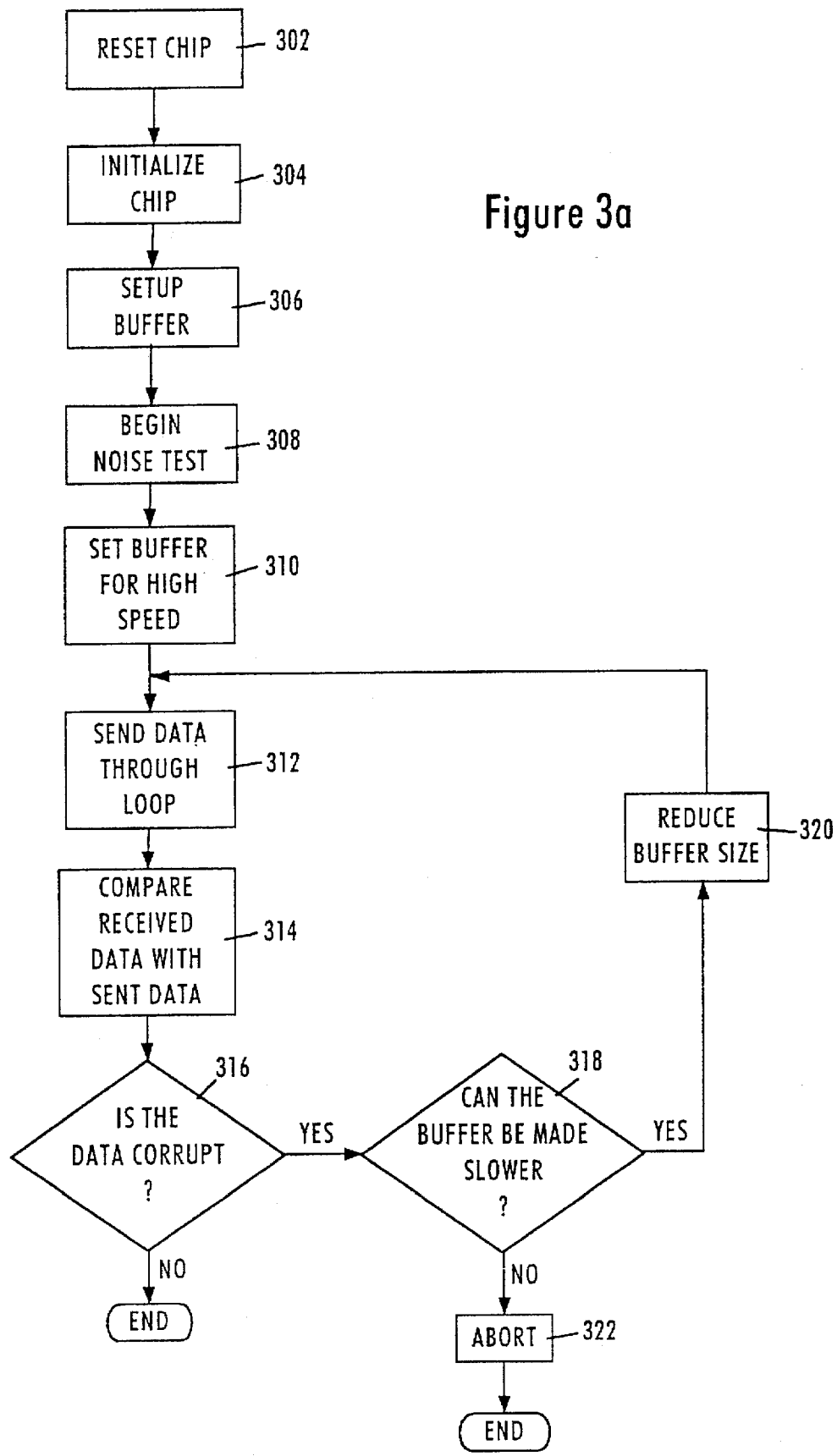
FIG. 3a is a flow-chart of an exemplary control program illustrating the present invention.

The programming device 60 operates in conventional fashion to supply corresponding bits to the registers 52–58. A simplified flow-chart of an exemplary control program that can be executed by the programmer 60 is shown in FIG. 3a. This program involves a noise test performed by creating a loop between an output and an input of the chip that comprises the buffer 40. At blocks 302 and 304, the chip is reset and initialized. Then, the buffer 40 is set up (block 306). The noise test begins at block 308, when an output of the chip is coupled by a loop with an input. Initially (at block 310), the buffer 40 is set for a fast signal. For example, binary number 1111 may be loaded into the registers 52–58 to cause the maximum number of active elements 42–48 to be enabled. At block 312, the output signal of the chip is sent through the loop to the input. The received data are compared with sent data at block 314. If the data is not corrupt (block 316), no correction of the buffer size is required. However, if the data is corrupt, the program determines at block 318 whether or not the buffer signal can be made slower. If the number of active elements 42–48 can be reduced, the program writes, for example, binary 0 into one or more of the registers 52–58 at block 320 to cause the corresponding active element or elements to be disabled, and returns to block 312. Steps 312–316 are repeatedly executed until the program determines at block 316 that the sent data is not corrupted, or determines at block 318 that the buffer size cannot be further reduced. If no further size reduction is possible, the program generates an alert signal at block 322.

Figure 4:
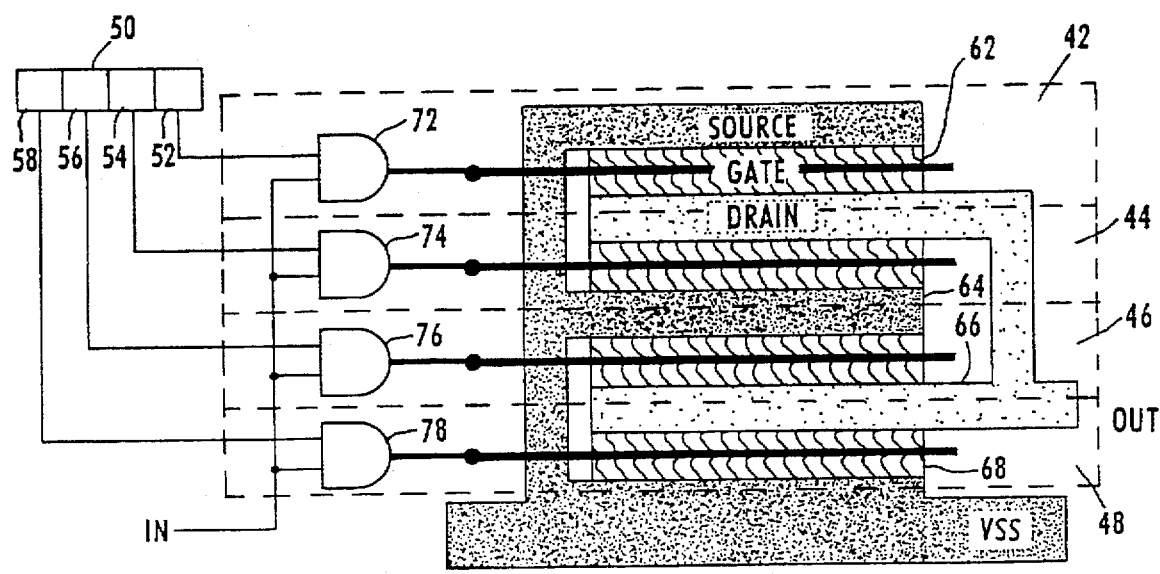
FIG. 4 is a diagram showing a buffer circuit comprising several MOSFET transistors according to the preferred embodiment of the present invention.

Referring to FIG. 4, the active elements 42–48 respectively comprise n-channel MOSFETs (Metal Oxide Semiconductor Field Effect Transistors) 62–68. The sources of the MOSFETs 62–68 are connected to the negative terminal Vss of a power supply. The drains of the MOSFETs 62–68 are coupled to the output OUT of the buffer 40. The gates of the MOSFETs 62–68 are coupled to the controller 50 through AND gates 72–78, respectively. The first inputs of the AND gates 72–78 are respectively connected to the registers 52–58 of the controller 50, whereas the second inputs are coupled to the input IN of the buffer 50. The outputs of the AND gates 72–78 are respectively connected to the gates of the MOSFETs 62–68. Thus, binary 0 in one or more of the registers 52–58 causes the outputs of the corresponding AND gates 72–78 to go low. It results in turning the corresponding ones of the MOSFETs 62–68 off.

Figure 5:
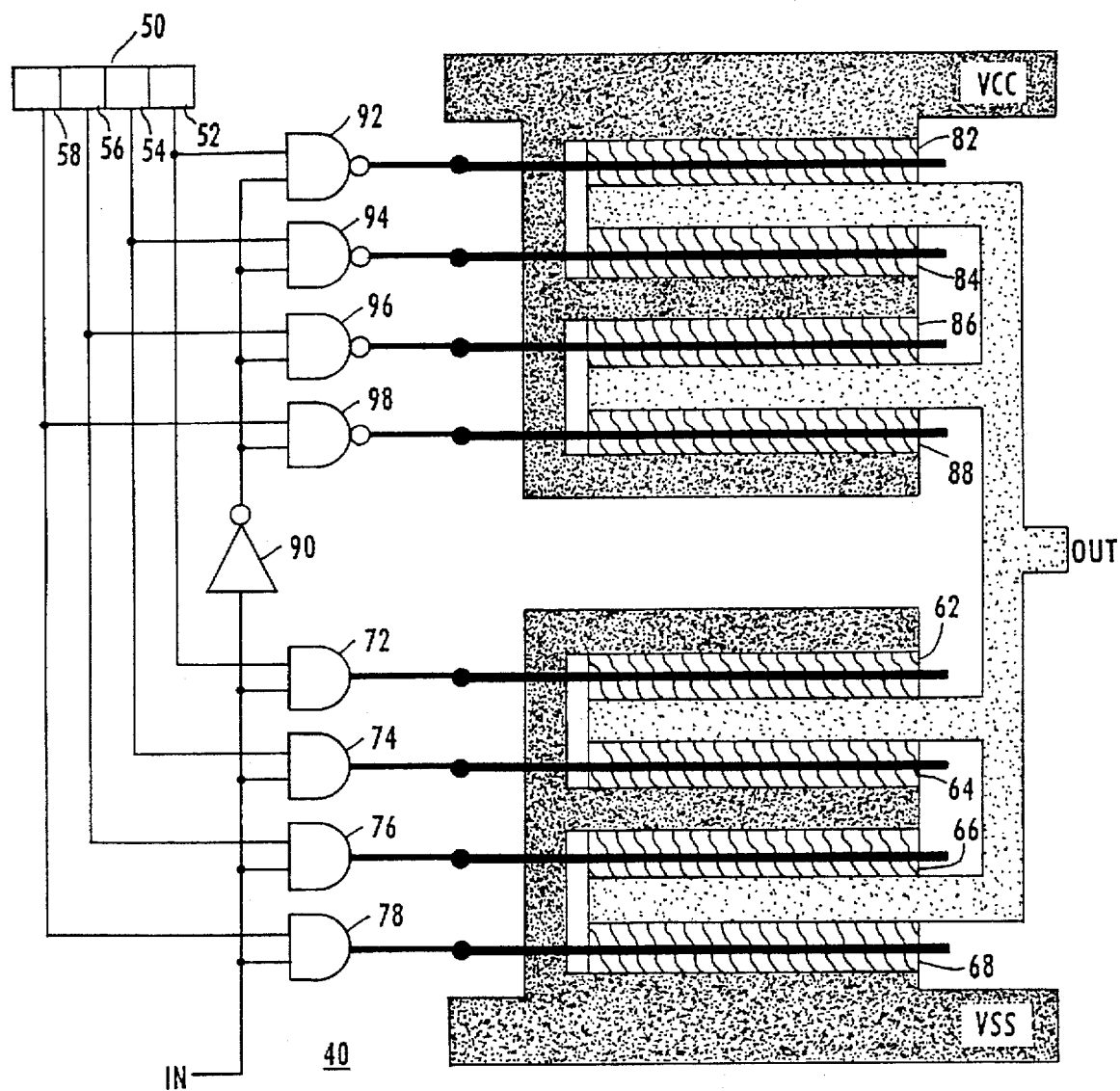
FIG. 5 is a diagram showing the buffer circuit comprising a combination of p- and n-channel MOSFET transistors.

Reference is now made to FIG. 5 of the drawings showing the buffer 40 comprising a combination of n- and p-channel MOSFETs. The active element 42 is represented by the n-channel MOSFET 62 and p-channel MOSFET 82, the active element 44 comprises the n-channel MOSFET 64 and p-channel MOSFET 84, the active element 46 comprises the n-channel MOSFET 66 and p-channel MOSFET 86, and the active element 48 is represented by a combination of the n-channel MOSFET 68 and the p-channel MOSFET 88. The registers 52–58 of the controller 50 are respectively coupled to the gates of the n-channels MOSFETs 62–68 through the AND gates 72–78, and to the gates of the p-channel MOSFETs 82–88 through the NAND gates 92–98. The sources of the n-channel MOSFETs 62–68 are coupled to the negative terminal Vss of the power supply, whereas the sources of the p-channel MOSFETs 82–88 are connected to the positive terminal Vcc of the power supply. The drains of the MOSFETs 62–68 and 82–88 are coupled to the output OUT of the buffer 40. The n-channel MOSFETs 62–68 are controlled by the controller 50 using the AND gates 72–78, as explained above in connection with FIG. 4. The gates of the p-channel MOSFETs 82–88 are respectively connected to the outputs of the NAND gates 92–98, having their first inputs respectively coupled to the registers 52–58 and second inputs coupled to the input IN of the buffer 40 through an inverter 90. Binary 0 in one or more of the registers 52–58 causes the outputs of the corresponding NAND gates 92–98 to go high. It results in turning the corresponding ones of the MOSFETs 82–88 off.

Figure 6:
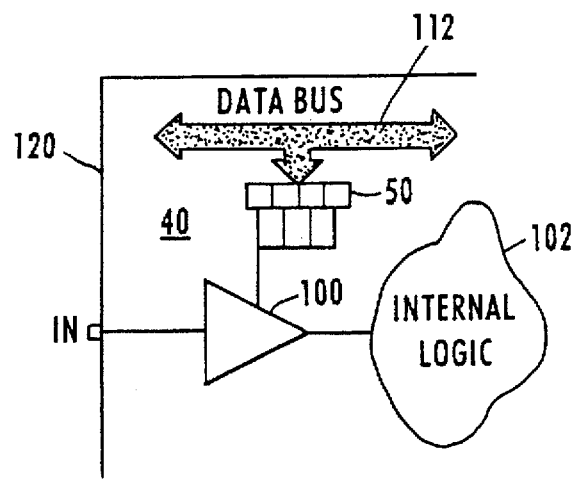
FIG. 6 is a diagram showing an application of the buffer according to the present invention for driving a logic circuit.
Figure 7:
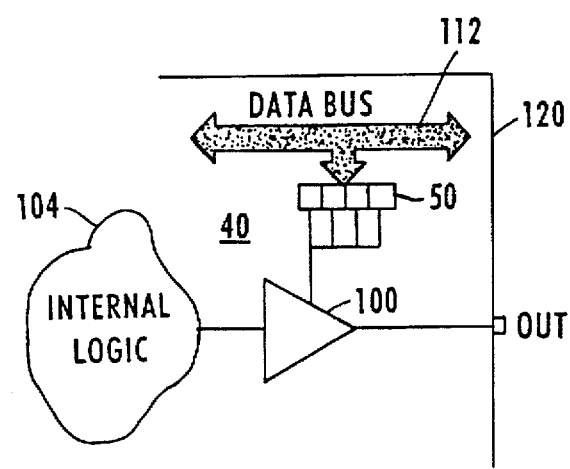
FIG. 7 is a diagram showing an application of the buffer according to the present invention for modifying output signals of a logic circuit.

Reference is now made to FIGS. 6 and 7, wherein the applications of the buffer 40 for driving a logic circuit 102 and for driving a load of a logic circuit 104 are respectively shown. In FIGS. 6 and 7 the active elements 42–48 are symbolically shown as a unit 100. As shown in FIG. 6, the buffer 40 may be located on an integrated circuit chip 120 to modify a rise time of the signals supplied to the logic circuit 102 located on the same chip 120. The controller 50 are coupled through a data bus 112 to the programming device 60, which may be external with respect to the chip 120, or may be located on the same chip with the buffer 40. FIG. 7 shows the buffer 40 located on the integrated circuit chip 120 to drive an external load (not shown) of the logic circuit 104 located on the same chip 120. As indicated above, the buffer 40 may attenuate the signals supplied to the load external with respect to the chip 120.

Figure 8:
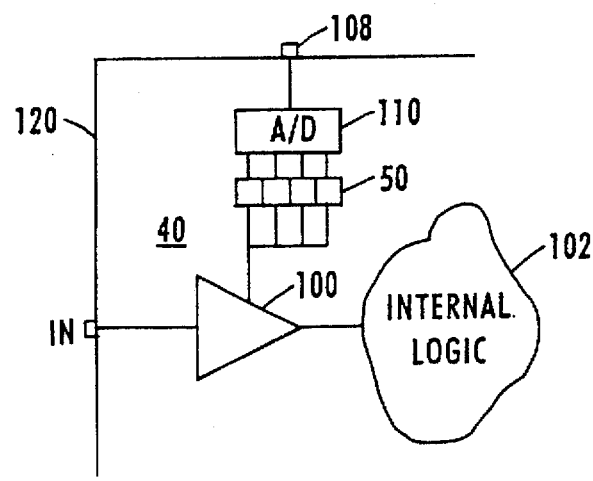
FIG. 8 is a diagram illustrating the buffer controlled by an analog signal.

Referring to FIG. 8, the buffer 40 may be controlled by an analog voltage supplied to the chip 120 through a control terminal 108. In this case, the terminal 108 is coupled to the controller 50 through an analog-digital converter to form a digital control value loaded into the registers of the controller 50, which control the active elements 42–48 symbolically represented by a unit 100.

Figure 9:
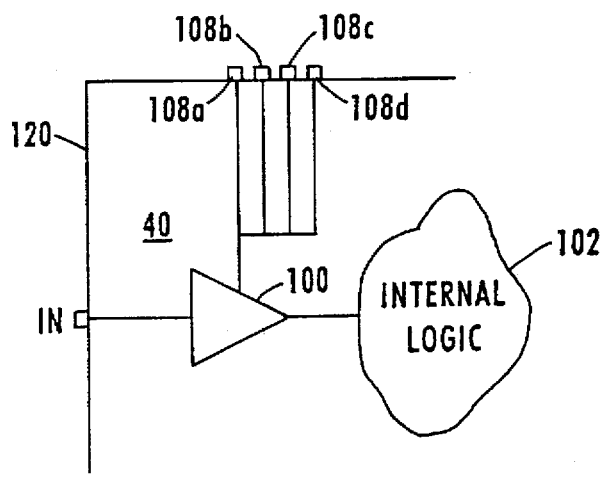
FIG. 9 is a diagram illustrating the buffer controlled by instructions created by interconnection of wires on an external control panel.

As shown in FIG. 9, the sequence of instructions that form the program for controlling the buffer 40 may be created by interconnection of wires on an external control panel (not shown) coupled to the integrated circuit chip 120 through a control terminals 108a, 108b, 108c and 108d, which are respectively connected directly to the active elements 42–48 symbolically shown as a unit 100.

Figure 10:
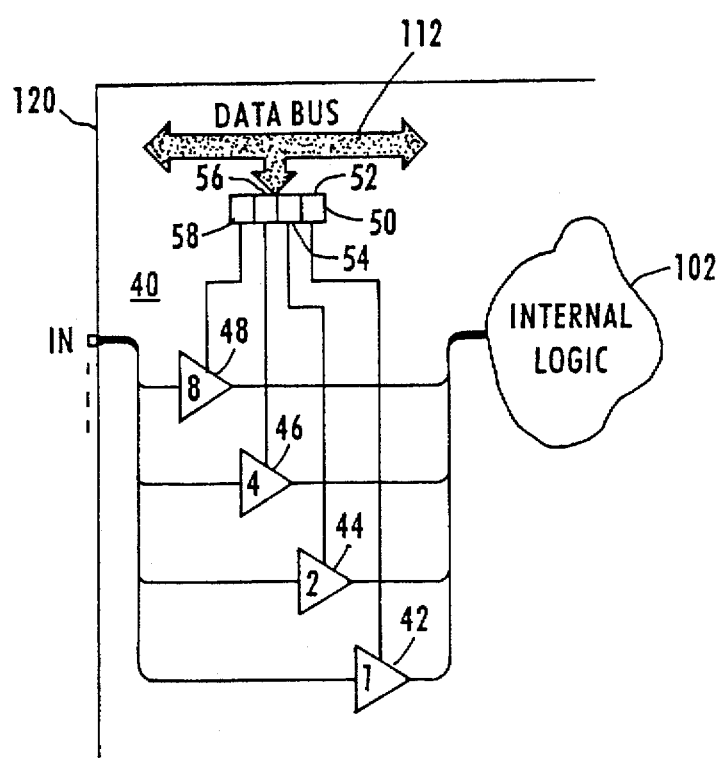
FIG. 10 is a diagram illustrating the buffer having binary selectable driving characteristics.

Reference now is made to FIG. 10, wherein the architecture of the buffer 40 makes it possible to provide binary selectable buffer driving characteristics. According to this embodiment of the present invention, the registers 52–58 of the programmable controller 50 are loaded with a four-digit binary number supplied through the data bus 112 by the programming device 60, which may be located on the same chip with the buffer 40, or may be external with respect to the chip. The register 52 stores the least significant bit and the register 58 stores the most significant bit. The active element 42 coupled to the register 52 comprises one MOSFET, the active element 44 coupled to the register 54 includes two identical MOSFETs connected in parallel, the active element 46 coupled to the register 56 comprises four identical MOSFETs connected in parallel and the active element 48 coupled to the register 58 includes eight identical MOSFETs connected in parallel. Alternatively, a transistor of n-times gatewidth in place of n parallel MOSFETs may be used as a corresponding active element. Thus, the number of the parallel MOSFETs in each of the active elements 42–48 (or the gatewidth of the transistor) is determined by the maximum value of the digit stored in the corresponding register 52–58. As the total number of the MOSFETs turned on at a given time is equal to the binary number entered into the controller 50, the buffer 40 supplies the logic circuit 120 with a signal having a binary selectable strength from 0 (all MOSFETS are off) to 15 (all MOSFETs are on). There accordingly has been described a buffer with drive characteristics, including slew rate and strength of output signal, controllable by software depending on the use of the buffer. The buffer can be made as a standard part, customizable by the user to make speed critical signals stronger and faster and to weaken other signals in order to reduce system noise. The drive characteristics of the buffer can be modified by software once the chip, which comprises the buffer, is fabricated. The software control allows field reconfiguration reducing a design iteration. Therefore, the development cost is reduced.

In this disclosure, there is shown and described only the preferred embodiment of the invention, but it is to be understood that the invention is capable of changes and modifications within the scope of the inventive concept as expressed herein.

I claim:

1. A buffer for modifying a strength and a rise time of signals in integrated circuit devices comprising:

an input terminal for receiving an input signal, an output terminal for producing an output signal, a plurality of transistor elements forming a parallel circuit between said input and output terminals, each of said transistor elements having a control terminal not connected with control terminals of other transistor elements in said plurality of transistor elements, and programmable control means coupled to said transistor elements for supplying control signals to said control terminals to independently control said transistor elements so as to add or delete at least one of said transistor elements to or from said parallel circuit in accordance with a preset program to modify strength of said output signal with respect to strength of said input signal.

2. The buffer of claim 1, wherein said plurality of transistor elements comprises a plurality of switching devices coupled in parallel between said input and output terminals.

3. The buffer of claim 2, wherein said plurality of switching devices comprises a plurality of MOSFET transistors, having gates coupled to said input terminal and drains coupled to said output terminal.

4. The buffer of claim 1, wherein said programmable control means comprises a register for storing a plurality of binary digits.

5. The buffer of claim 4, wherein said plurality of active elements comprises a plurality of linear arrays controlled by the plurality of binary digits, number of said linear arrays is equal to a number of the binary digits in said register.

6. The buffer of claim 5, wherein each of said arrays comprises a number of switching elements equal to a maximum value of the corresponding binary digit.

7. The buffer of claim 1, wherein said programmable control means comprises an analog-digital converter means for converting an analog control signal into a digital value.

8. The buffer of claim 1, wherein said control means reduces the number of said transistor elements coupled between said input and output terminals when an output signal of said buffer is corrupt.

9. A buffer circuit for modifying a strength and a rise time of signals in integrated circuit devices comprising:

an input terminal for receiving an input signal, an output terminal for producing an output signal, a plurality of transistor devices coupled in parallel to form a parallel circuit between said input terminal and said output terminal and having control terminals not connected with each other, and a programmable controller coupled to said plurality of transistor devices for supplying a predetermined control signal to said control terminals to independently control the transistor elements so as to add a first predetermined number of said transistor devices to said parallel circuit in response to a first value of said control signal or delete a second predetermined number of said transistor devices from said parallel circuit in response to a second value of said control signal, in order to modify strength of said output signal with respect to strength of said input signal.

10. The buffer circuit of claim 9, wherein said plurality of transistor devices comprises a plurality of MOSFET transistors, having gates coupled to said input terminal and drains coupled to said output terminal.

11. The buffer circuit of claim 10, wherein said programmable controller comprises a register for storing said preset control value coupled to said gates.

12. The buffer circuit of claim 9, wherein said plurality of transistor devices comprises groups of switches corresponding to the digits of said preset control value, a number of said groups is equal to a number of the digits of said preset control value.

13. The buffer circuit of claim 12, wherein a number of the switches in each of said groups is equal to a maximum value of the corresponding digit.

14. The buffer circuit of claim 13, wherein said preset control value is represented by a binary number.

15. The buffer circuit of claim 9, wherein said preset control value is loaded into said programmable controller by an external programming means.

16. The buffer circuit of claim 9, wherein said controller reduces the number of said transistor devices coupled between said input and output terminals when an output signal of said buffer circuit is corrupt.

17. Apparatus for driving circuits of an integrated circuit chip comprising:

a driving circuit located on said integrated circuit chip for modifying a strength and a rise time of signals applied to the driven circuits including:

an input for receiving an input signal, an output for producing an output signal, a plurality of transistors forming a parallel circuit between said input and said output and having control terminals not connected with each other, programmable control means coupled to said plurality of transistors for supplying a preset control value to said control terminals to control said transistors independently from each other so as to add or delete at least a predetermined one of said transistors to or from said parallel circuit, to modify strength of said output signal with respect to strength of said input signal in accordance with said preset control value, and programming means external with respect to said integrated circuit chip for loading said preset control value into said programmable control means.

18. The apparatus of claim 17, wherein said programming means comprises a control panel forming the preset control value by interconnection of wires.

19. The apparatus of claim 17, wherein said control means reduces the number of said transistors coupled between said input and said output when an output signal of said driving circuit is corrupt.

* * * * *